United States Patent [19]

Khadder et al.

[11] Patent Number: 4,512,815

[45] Date of Patent: Apr. 23, 1985

[54] SIMPLIFIED BIFET PROCESS

[75] Inventors: Wadie N. Khadder, Sunnyvale; Jia T. Wang, San Jose; Brian E. Hollins, Los Altos, all of Calif.

[73] Assignee: National Semiconductor Corporation, Santa Clara, Calif.

[21] Appl. No.: 462,498

[22] Filed: Jan. 31, 1983

Related U.S. Application Data

[62] Division of Ser. No. 153,486, May 27, 1980, Pat. No. 4,412,238.

[51] Int. Cl.³ .................... H01L 7/54; H01L 29/78
[52] U.S. Cl. .................... 148/1.5; 29/577 C; 29/571; 29/576 B; 148/187; 357/43; 357/91
[58] Field of Search ............ 148/1.5, 187; 29/577 C, 29/571, 576 B; 357/43, 91

[56] References Cited

U.S. PATENT DOCUMENTS

| | | | |
|---|---|---|---|
| 4,108,686 | 8/1978 | Jacobus, Jr. | 148/1.5 |
| 4,176,368 | 11/1979 | Compton | 357/22 |
| 4,346,512 | 8/1982 | Liang et al. | 29/571 |
| 4,362,574 | 12/1982 | Gevondyan | 148/1.5 |

OTHER PUBLICATIONS

Ma et al, IBM-TDB, 16, (1973), 2287.
Antipov, IBM-TDB, 18, (1975), 1401.

*Primary Examiner*—Upendra Roy
*Attorney, Agent, or Firm*—Gail W. Woodward; Paul J. Winters; Michael J. Pollock

[57] ABSTRACT

In a monolithic semiconductor integrated circuit, conventional bipolar transistors are fabricated along with thin ion implanted junction field effect transistors, to create BIFET structures. After the conventional isolation diffusion, the surface oxide is stripped off and the semiconductor wafer ion implanted with slow diffusing impurities of a conductivity type, the same as the undiffused surface material. Then the bipolar transistors, along with the junction field effect transistors, are fabricated using conventional oxide masked diffusion processes. The field effect device sources and drains employ the base diffusions of the bipolar transistors while the gate contact is achieved with an emitter diffusion. The field effect device channels are formed at a depth substantially greater than that of the impurities deposited in the original ion implant. If desired, an ion implanted top gate can be established over the channel. The wafer is then annealed and processed in accordance with conventional techniques. Since the original ion implant covers the entire surface of the circuit, it will act as a field inversion prevention layer thus, improving the circuit reliability. The field effect devices can be fabricated with one less masking step when compared with the prior processes.

5 Claims, 6 Drawing Figures

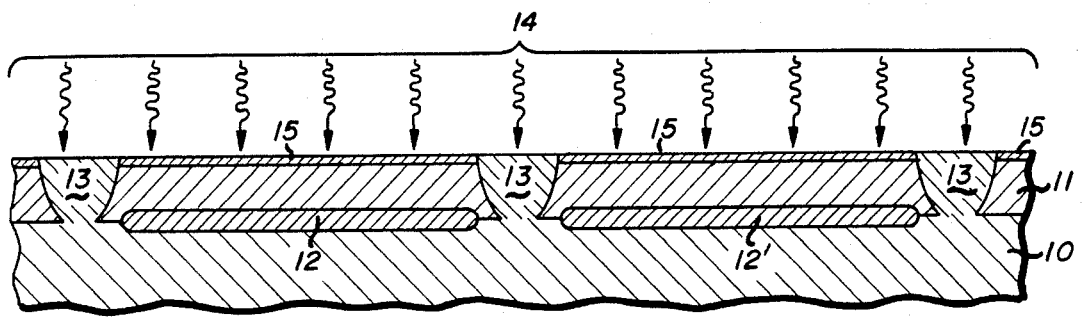
Fig_1
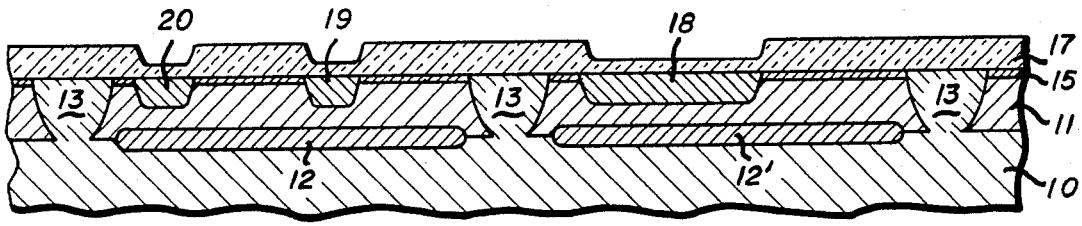
Fig_2
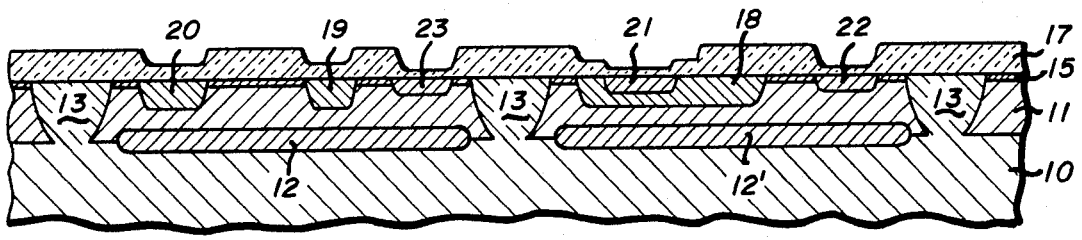
Fig_3
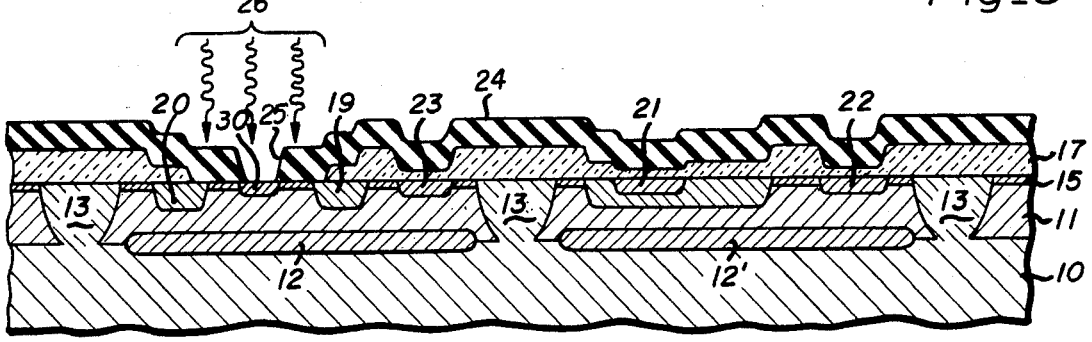
Fig_4
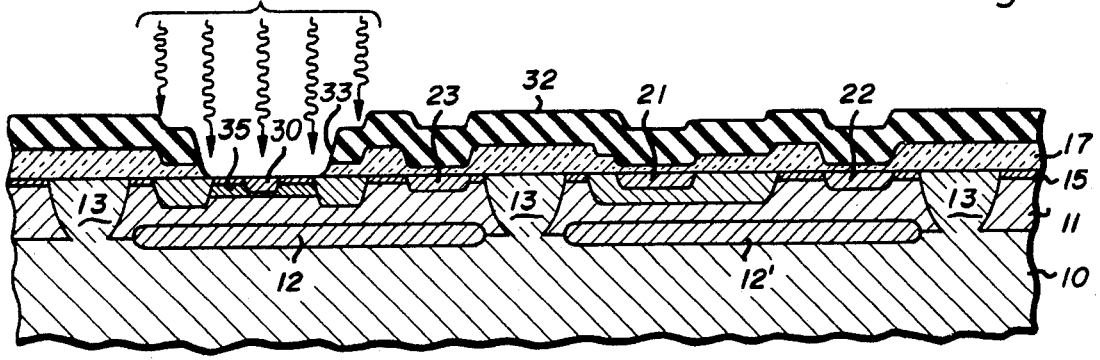
Fig_5

SIMPLIFIED BIFET PROCESS

This is a division of application Ser. No. 153,486, filed May 27, 1980, now U.S. Pat. No. 4,412,238.

BACKGROUND OF THE INVENTION

The invention relates to the fabrication of BIFET monolithic integrated circuit (IC) devices. These ordinarily include a combination of bipolar junction transistor (BJT) devices and junction field effect transistor (JFET) devices manufactured together in a compatible process. Typically, the JFET devices are manufactured using ion implantation in relatively thin structures that can be mass produced with consistent characteristics. If desired, the JFET structure performance can be improved using the approach disclosed in U.S. Pat. No. 4,176,368 which issued Nov. 27, 1979, to the assignee of the present application.

In copending application Ser. No. 153,805 filed May 27, 1980 by Brian E. Hollins and titled BIPOLAR SEMICONDUCTOR PROCESS AND STRUCTURE FOR IMPROVED RELIABILITY, a process is described for making bipolar ICs. When that process is applied to circuits that include thin JFETS, it has been standard practice to apply the process by a masked ion implant operation to the IC process. The JFET devices are then fabricated by masked ion implant operations to create channel and top gate electrodes. The completed IC includes a passivating oxide with conventional metallization thereon, and an overcoat of silicon nitride, deposited by a plasma process, to passivate the structure.

SUMMARY OF THE INVENTION

It is an object of the invention to produce BIFET structures using a simplified fabrication process.

It is a further object of the invention to create a field passivation of BJT devices while manufacturing JFET devices in a monolithic IC wafer.

It is still a further object of the invention to provide a simplified process for creating a surface inversion prevention layer along with JFET devices in a BIFET IC.

These and other objects are achieved as follows: A starting wafer of semiconductor material includes a conductive substrate overcoated with an opposite conductivity epitaxial layer having a conductivity suitable for BJT collectors. The wafer may also include buried inserts of high conductivity of the same type as the epitaxial layer; these are located in those circuit regions where active devices will be fabricated. Isolation diffusions are included that completely penetrate the epitaxial layer, and are located to surround active devices. These diffusions are the same conductivity type as the substrate, and act to isolate separate tubs of exitaxial material with a PN junction that can be reverse biased. Thus far, the construction is conventional.

At this point, the wafer surface is stripped of oxide and ion implanted with a slow, diffusing impurity of the same conductivity type as that of the epitaxial layer. The ion dose level is adjusted so that after wafer processing, the surface doping will be of the proper magnitude to prevent unwanted surface inversion in the semiconductor.

Then, the BJT bases and JFET source and drain electrodes are simultaneously diffused with a conductivity type impurity opposite to that of the epitaxial layer. This is followed by BJT emitter diffusion, and at the same time the BJT collector contacts and JFET gate contacts are established.

After emitter diffusion, the wafer is coated with photoresist, except where the JFET top gates are desired, and the top gate regions are stripped of oxide and ion implanted. Using a second photoresist mask that exposes the JFET channel regions, the oxide is stripped off and the channels ion implanted using an impurity of the same conductivity type as the source and drain regions.

The photoresist is then removed and the wafer covered with deposited oxide and treated conventionally for gettering action. The wafer is then run through an anneal cycle. Next, the wafer is metallized and the metal etched to form the desired circuit conductor pattern. The metallized wafer is then coated with a plasma deposited nitride for passivation. Finally, holes are etched into the nitride coating for external circuit contacts.

Thus, the treated circuits are all overcoated with the original implanted ions which will make the surface sufficiently conductive to avoid surface inversion. The same layer lies over those channel portions of the JFETS that would ordinarily be exposed at the semiconductor surface. Thus, the channels are entirely located subsurface by the same layer that prevents surface inversion.

BRIEF DESCRIPTION OF THE DRAWING

FIGS. 1–5 are cross-section views of a semiconductor fragment illustrating the various steps in the process of the invention.

Figure 6:
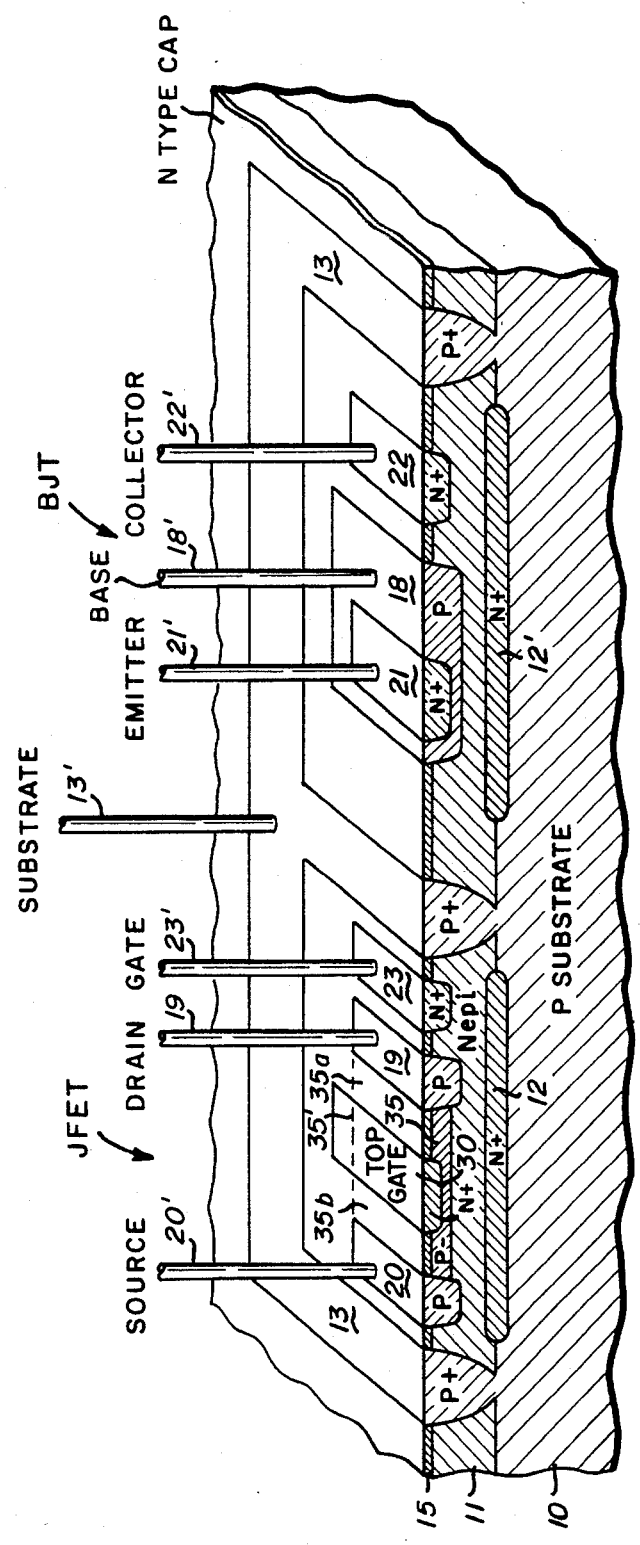
FIG. 6 is a combination cross section and front elevation of a portion of a BIFET structure. In this drawing, the oxide and passivating layers, along with the metallization, have been removed to better illustrate the structure.

The drawings are not to scale. The vertical dimensions have been exaggerated so the various layers can be seen more clearly.

DESCRIPTION OF THE INVENTION

FIG. 1 illustrates a fragment of a semiconductor wafer that is to be made to include BJT and JFET structures. A P-type silicon substrate 10 is overcoated with an N-type epitaxial layer 11. Conductive buried layers 12 and 12′ are formed from slowly diffusing impurities, such as arsenic or antimony deposited onto substrate 10 prior to epitaxy. Isolation diffusions 13 are made using a P-type impurity and extend completely through epitaxial layer 11 so as to isolate separate regions of epitaxial material. As will be shown later in FIG. 6, regions 13 form a pair of loops that act to produce adjacent tubs of PN junction isolated epitaxial material. A BJT will be formed over insert 12′ and a JFET will be formed over insert 12.

After isolation, the wafer surface is stripped of oxides and placed in an ion implantation device. Here, arsenic ions 14 are implanted in the semiconductor surface at 15. Arsenic is selected because it is a slow diffuser and will not be greatly altered in subsequent processing. For example, about $2.3 \times 10^{12}$ arsenic atoms per cm$^2$ can be implanted at 40 keV.

Then, an oxide layer 17 is grown on the wafer and photolithographically etched to produce holes where transistor bases are desired. At the same time, the JFET source and drain electrodes are formed. Thus, base 18, source 20, and drain 19 are simultaneously produced by boron diffusion to a depth of about 3 microns, using conventional diffusion technology as shown in FIG. 2. Then, again using conventional oxide masked diffusion technology, phosphorus is diffused into the BJT emitter region 21, collector contact 22, and JFET gate contact 23. These phosphorous diffusions, shown in FIG. 3, are to a depth of about 2 microns and produce a surface concentration in excess of about $10^{19}$ atoms per $cm^3$.

The wafer is then coated with photoresist 24, as shown in FIG. 4, which has an opening 25 where the JFET devices are to have their top gate regions. The wafer is etched to remove the oxide inside hole 25. Then, phosphorus 26 is ion implanted to create top gate electrode 30. The top gate is made long enough to completely span the JFET channel, as will be shown hereinafter, and it is narrow enough to fit between the source and drain electrodes 20 and 19 without touching either one. In a typical structure, a 0.3 mil wide top gate is located 0.3 mil from the source and drain electrodes 19 and 20, thus making the source and drain about 0.9 mil apart.

Typically, the phosphorus for the top gate is ion implanted at 25 keV to a level of about $1 \times 10^{14}$ atoms per $cm^2$.

At this point, photoresist 24 is removed and a new resist 32 is applied as shown in FIG. 5. The hole at 33 operates as a mask for etching any oxide of the bottom of the hole. Then boron channel atoms 34 are ion implanted into the silicon at 35.

Typically, a two-step implant is employed. First, a dose of about $1.1 \times 10^{12}$ atoms per $cm^2$ of boron are implanted at 190 keV and then about $1.1 \times 10^{12}$ atoms per $cm^2$ are implanted at 100 keV. This produces a double-humped impurity profile.

The boron implant mask extends between source and drain electrodes and slightly overlaps so that there is no critical alignment. The depth is greater than either the top gate 30 or the cap 15. The top gate doping overwhelms the channel implant so as to form a PN junction therewith. The implanted cap 15 also overwhelms the channel at the surface of the semiconductor, thus forming a subsurface channel. Where the channel overlaps the source and drain 20 and 19, the boron diffusion predominates so the overlap has no effect.

Then, the photoresist is removed and the conventional processing steps applied to complete the wafer. This could include glass deposition, gettering, anneal, contact metallization, and plasma nitride overcoating. The gettering and anneal steps are critical to the ion implant because they are used to activate the ion implanted materials to make them electrically active in the semiconductor. Typically, the anneal involves heating to about 850° C. and then slowly cooling over a 3 hour period to about 550° C.

The ion implants and heating described above extend the channel 35 to a depth of less than about a micron. Top gate 30 is typically about 0.4 micron deep.

The completed structure is shown in FIG. 6 in which the oxide, metallization and nitride layers have been omitted for clarity. It can be seen that channel 35 partly lies under top gate 30. The two channel regions 35a and 35b flank the top gate 30. The channel extends to edge 35' shown as a dashed line under the top gate, which by its overlap, is ohmically connected to gate electrode 23. Even in regions 35a and 35b the channel is overcoated with cap 15, so that the entire channel is subsurface.

If desired, the top gate implant step can be omitted. In this case, cap 15 serves as the upper gate electrode; however, since it is more lightly doped, its gate action is modified.

In summary, cap 15 can have its doping adjusted to optimize the resistance of the silicon surface to inversion while the JFET and BJT electrodes are optimized for active device performance. If the cap doping is too high, the junction breakdown is too low. If the cap doping is too low, its resistance to surface inversion is impaired. The above described process produces breakdown voltages in excess of 50 volts while displaying excellent long-term reliability and resistance to surface inversion. With a top gate structure as shown, the cap can be optimized for desired breakdown voltage. Without the top gate, as shown, the cap doping may have to be slightly modified to obtain suitable JFET performance.

The invention has been described and a preferred process detailed. When a person skilled in the art reads the above disclosure, alternatives and equivalents, within the spirit and intent of the invention, will occur to him. Accordingly, it is intended that the scope of the invention be limited only by the following claims.

We claim:

1. The process for fabricating an integrated circuit containing bipolar junction transistors and junction field effect transistors, in a common substrate semiconductor of one conductivity type having thereon an epitaxial layer of opposite conductivity type and isolation diffusions of said one conductivity type isolating individual tubs of said epitaxial layer, comprising the steps:

removing oxides from the top surface of said epitaxial layer;

ion implanting a slow diffusing first impurity having said opposite conductivity type into said surface;

thereafter, forming by oxide masked diffusion, the base regions of said bipolar junction transistors simultaneously with the spaced-apart source and drain electrodes of said junction field effect transistors;

ion implanting a second impurity of said one conductivity type into the gate regions of said junction field effect transistors in the space between said source and drain electrodes to a depth exceeding that of said first impurity, whereby said first impurity layer acts as a top gate electrode for said junction field effect transistors, and as a field inversion prevention layer for said integrated circuit.

2. The process of claim 1 further including the step of ion implanting a third impurity of said opposite conductivity type in the space between, but not touching, said source and drain electrodes, and spanning said channel region, to a depth greater than said first impurity, but less than said second impurity; whereby said third impurity creates a top gate for said junction field effect transistors.

3. The process of claim 2 in which said substrate is P-type silicon said epitaxial layer is N-type, said first impurity is arsenic and said second impurity is boron.

4. The process of claim 3 in which said third impurity is phosphorus.

5. A method for forming a field effect device having source and drain regions formed in a first region of a semiconductor material and a bipolar device having base, collector and emitter regions formed in a second different region of the same semiconductor material, such field effect device having a buried channel region formed in the semiconductor material and spaced from a surface for such semiconductor material, such buried channel region having a conductivity type opposite the conductivity type of the semiconductor material, comprising the steps of:

(a) forming a doped layer in the semiconductor material extending from the surface of the semiconductor material to the buried channel region, such doped layer extending laterally along the surface of the semiconductor material through the source and drain regions of the field effect device and the emitter and base regions of the bipolar device, such doped layer having the same conductivity type as the conductivity type of the semiconductor material; and (b) forming a gate electrode electrically connected to both the formed doped layer and the semiconductor material.

* * * * *